(12) United States Patent
Damodaran et al.

(10) Patent No.: US 9,021,320 B2
(45) Date of Patent: Apr. 28, 2015

(54) PBIST ARCHITECTURE WITH MULTIPLE ASYNCHRONOUS SUB CHIPS OPERATING IN DIFFERING VOLTAGE DOMAINS

(71) Applicant: Texas Instruments Incorporated, Dallas, TX (US)

(72) Inventors: Raguram Damodaran, Plano, TX (US); Naveen Bhoria, Plano, TX (US); Aman Kokrady, Bangalore, IN (US)

(73) Assignee: Texas Instruments Incorporated, Dallas, TX (US)

( * ) Notice: Subject to any disclaimer, the term of this patent is extended or adjusted under 35 U.S.C. 154(b) by 123 days.

(21) Appl. No.: 13/709,168

(22) Filed: Dec. 10, 2012

(65) Prior Publication Data

US 2014/0164854 A1    Jun. 12, 2014

(51) Int. Cl.
G11C 29/00 (2006.01)
G11C 29/12 (2006.01)
G11C 5/14 (2006.01)
G11C 29/16 (2006.01)
G11C 29/04 (2006.01)

(52) U.S. Cl.
CPC ............ *G11C 29/12* (2013.01); *G11C 5/147* (2013.01); *G11C 29/12005* (2013.01); *G11C 29/16* (2013.01); *G11C 2029/0401* (2013.01)

(58) Field of Classification Search
CPC .............................. G11C 29/56; G11C 29/48
USPC ............................ 714/718, 733, 744, 42, 30
See application file for complete search history.

(56) References Cited

U.S. PATENT DOCUMENTS

| | | | |
|---|---|---|---|
| 7,127,640 B2 * | 10/2006 | Parulkar et al. | 714/30 |
| 2004/0073841 A1 * | 4/2004 | Toros et al. | 714/30 |
| 2005/0015671 A1 * | 1/2005 | Parulkar et al. | 714/30 |

* cited by examiner

*Primary Examiner* — Fritz Alphonse
(74) *Attorney, Agent, or Firm* — Robert D. Marshall, Jr.; Frederick J. Telecky, Jr.

(57) ABSTRACT

A programmable Built In Self Test (pBIST) system used to test embedded memories where the memories may be operating at a voltage domain different from the voltage domain of the pBIST. A plurality of buffer and synchronizing registers are used to avoid meta stable conditions caused by the time delays introduced by the voltage shifters required to bridge the various voltage domains.

2 Claims, 3 Drawing Sheets

PBIST ARCHITECTURE WITH MULTIPLE ASYNCHRONOUS SUB CHIPS OPERATING IN DIFFERING VOLTAGE DOMAINS

TECHNICAL FIELD OF THE INVENTION

The technical field of this invention is high speed memory testing, and more particularly a built-in self-test (BIST) system for embedded memories.

BACKGROUND OF THE INVENTION

Testing fabricated integrated circuits to determine proper operation has always been a challenging task, particularly with regard to on-board memory functions.

There are two major types of device malfunctions caused by design defects. A design defect arises when the integrated circuit was manufactured to a design specification that did not provide proper function for the intended use purpose. Such a defect affects any manufactured integrated circuit until the design defect is corrected. The integrated circuit manufacturer must detect and correct such defects before shipping large number of devices to customers to avoid a costly recall. In contrast to a design defect, a manufacturing defect involves some fault in the manufacture of the integrated circuit. A manufacturing defect will generally affect less than all parts manufactured. Such defects are corrected by identification and correction of the manufacturing fault.

Most integrated circuit manufacturers test integrated circuits for proper operation before shipment to customers. Increasing integrated circuit complexity makes this testing increasingly difficult. Rather than rely on increasingly expensive external testing devices, many manufacturers test integrated circuits using a built-in self-test (BIST). BIST uses circuits on the integrated circuit designed solely to test the integrated circuit. When triggered either automatically in circuit operation or by an external test device, the BIST circuits produce a set of test conditions run on the ordinary circuit hardware. Comparison of the state of the integrated circuit following test to an expected state indicates whether the integrated circuit passed. An example of such a test is writing to a read/write memory and recalling the data written. A match between the data written and the data read passes the test. BIST typically involves other more complex tests.

A subset of BIST is programmable built-in self test (pBIST) that uses a general purpose test engine programmed by a set of instructions. This set of test instructions is typically stored on the integrated circuit in a read only memory (ROM) and includes instructions particularly developed for that integrated circuit. pBIST enables re-use of hardware and test instructions to cover a family of similar but not identical integrated circuits.

U.S. Pat. No. 7,324,392 entitled ROM-Based Memory Testing includes a description of an exemplary set of instructions for use in a pBIST. This patent is incorporated by reference in its entirety.

In conventional VLSI systems memory testing is done in three steps. In the first step hardwired logic (often available through third-party vendors, examples are memBIST (MBIST) use algorithms developed before the device is committed to tape-out. Determining the detailed make-up of hardwired logic is not feasible at this time. It is impossible to predict the appropriate hardware circuits because the necessary information comes from process model drivers during the process qualification window. Secondly, conventional memory testing attempts to close testing gaps using CPU based techniques. These techniques have a number of limitations. A major limitation is the CPU interface with largely inaccessible memory functions. The inability to do back-to-back accesses to all memories is another severe limitation. Thirdly, during memory testing while the device is in wafer form direct memory access (DMA) external memory accesses cannot be accomplished at full processor speed. This may result in a significant number of failures not being observable.

SUMMARY OF THE INVENTION

An SOC (System On Chip) usually contains a plurality of sub chips performing embedded memory system testing and data logging functions, and some of these sub chips and embedded memories may be operating at different voltages, speeds and bus widths.

This invention describes an embedded memory test system wherein a pBIST engine is employed that is capable of asynchronously interfacing to a plurality of sub chips and embedded memory systems operating within different voltage and timing domains.

BRIEF DESCRIPTION OF THE DRAWINGS

These and other aspects of this invention are illustrated in the drawings, in which.

DETAILED DESCRIPTION OF PREFERRED EMBODIMENTS

SRAM/memory structures of different devices vary by technology, design and implementation. To test memories effectively the address access pattern sequence of the memory testing algorithm should follow a particular pattern that sensitizes and tests the electrical structure within the memory.

In a simple memory structure the physical addresses and logical addresses are contiguous and are matched. Effective testing can be preformed with simple algorithms that linearly increment or decrement addresses. In these memories any possible address scrambling automatically matches the input to the output. Namely bit <0> of the input goes to bit <0> of the output and so on.

Figure 1:
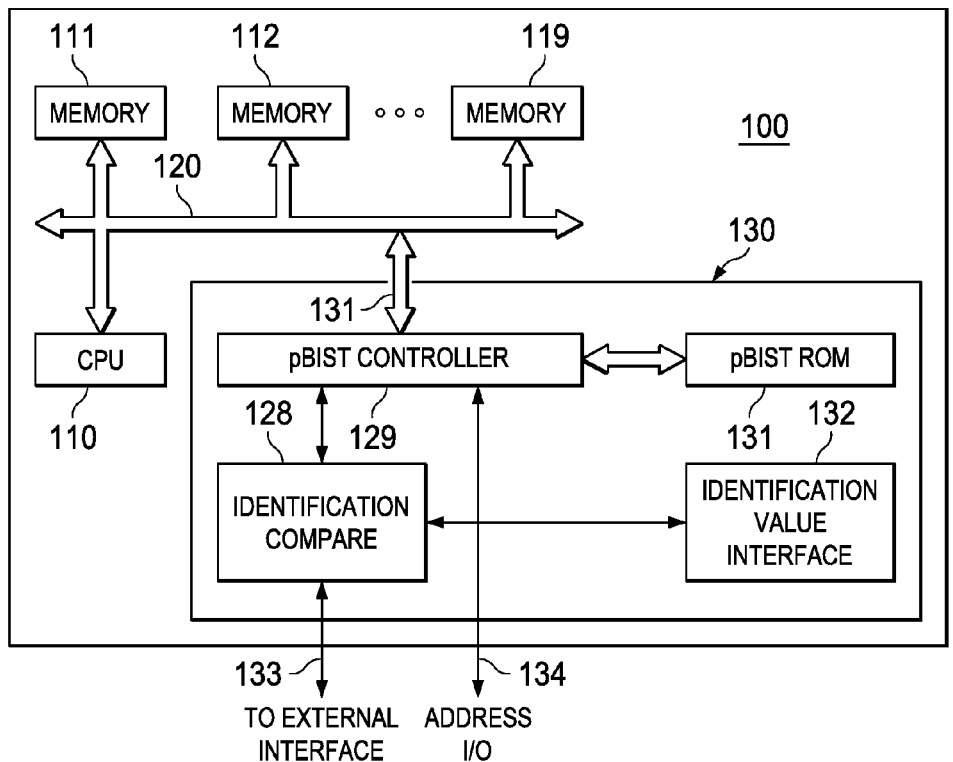
FIG. 1 is a block diagram of a programmable BIST (pBist) unit built into a CPU/memory function of the prior art)

FIG. 1 illustrates a representative prior art integrated circuit (IC), a system-on-chip (SOC) device 100 that includes programmable built-in self-test (pBIST) 130.

The SOC device 100 includes multiple modules that can be highly complex to test. SOC 100 includes central processing unit (CPU) 110 and memories 111 and 112 through 119 coupled by bus 120. Other SOC devices may include multiple processors, complex assemblages of memory and cache subsystems, peripheral devices and interfaces, various types of memory storage such as random access memory (RAM), read only memory (ROM) and possibly various types of alterable memory or flash ROM.

The programmable built-in self-test unit pBIST 130 includes a pBIST controller 129, pBIST ROM 131, an ID Value interface 132, ID Compare unit 128 and external interface 133. pBIST controller 129 controls SOC tests in much the same fashion as CPU 110 controls the normal operation of integrated circuit 100. pBIST unit 130 is controlled by test instructions stored in pBIST ROM 131. pBIST unit 130 may couple to circuits outside integrated circuit 100 via external interface 133. Addresses enter and exit pBist unit 130 via Address I/O 134.

pBIST controller 129 selects a particular pBIST controller within a group of pBIST controllers by using a pBIST ID (identification) value interface 132. The pBIST ID value is typically a five-bit value that allows selection of up to thirty-one pBIST controllers.

Figure 2:
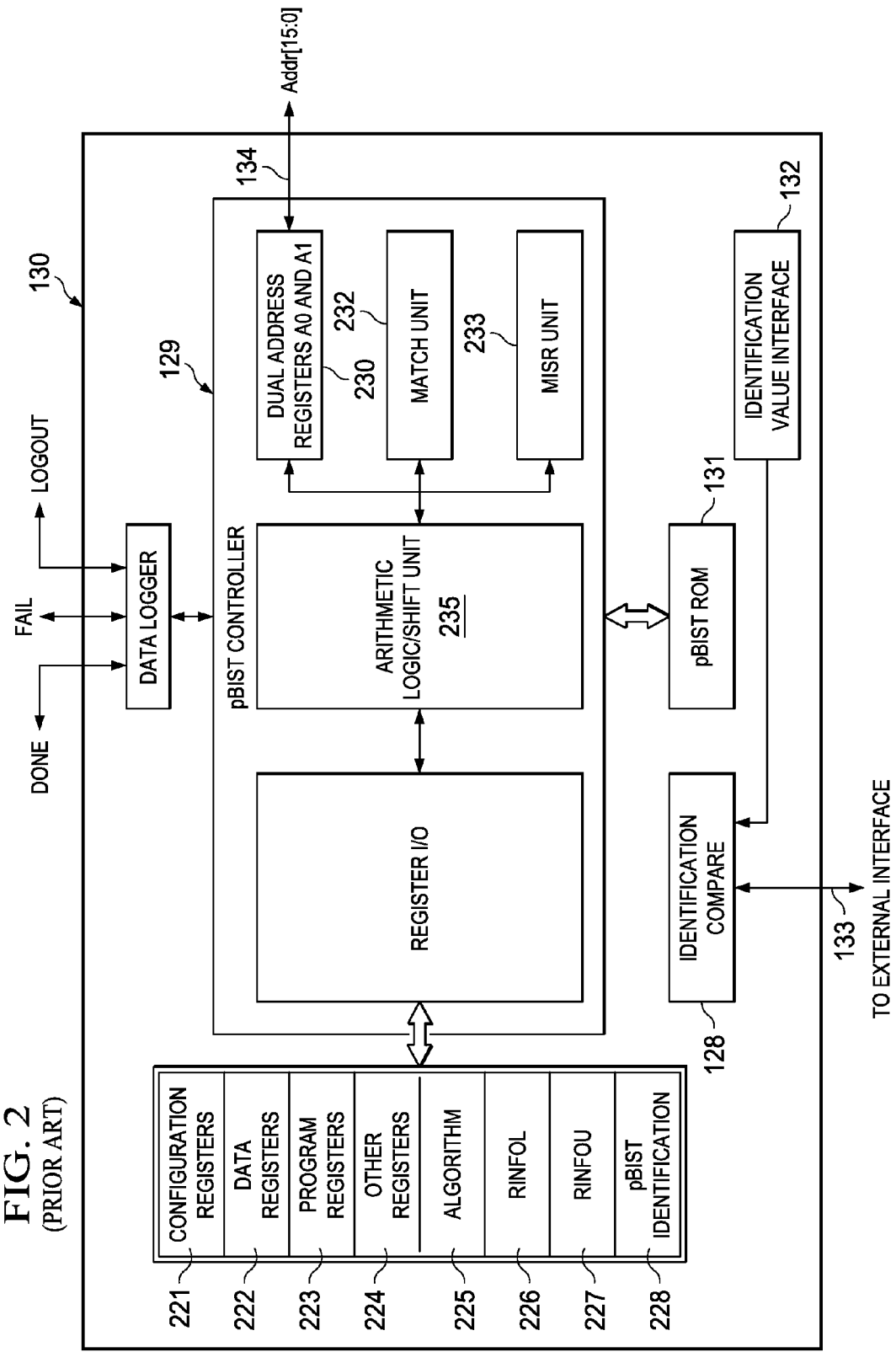
FIG. 2 is a detailed block diagram of a pBist controller of the prior art.

FIG. 2 is a block diagram of functional units included in prior art pBist 130. pBIST unit 130 includes pBIST controller 129, registers 221 through 228, dual address register 230, match unit 232 and multiple input signature register (MISR) unit 233. Addr[15:0] I/O 134 allows for input or output of pBist addresses.

Configuration registers 221 through 228 are memory mapped within the address space of CPU 110. Thus CPU 110 can read from or write to any register 221 through 228 by a memory operation to the corresponding address. Configuration registers 221 through 228 control the configuration and the operational mode of pBIST unit 130. Data registers 222 store test data recalled from pBIST ROM 131. Program registers 223 store test program instructions recalled from pBIST ROM 131. Other registers 224 include miscellaneous general-purpose registers. Configuration registers 221 includes four additional registers algorithm register 225, upper RAM information (RINFOL) register 226, lower RAM information (RINFOU) register 227 and pBIST ID register 228 which will be more fully discussed below.

Algorithm register 225 is actually an algorithm mask register. Bit [0] of this register indicates whether the first algorithm stored in pBIST ROM 131 would be executed. Bit [1] indicates whether the second algorithm is executed and so on. A total of 32 algorithms stored in pBist ROM 131 can be controlled the 32-bit word width of algorithm register 225. For an algorithm to be executed, both the corresponding bit of algorithm register 225 and a valid bit in the previous algorithm header must be set.

RINFOL register 226 and RINFOU register 227 are group mask registers similar to algorithm register 225. RINFOL register 226 and RINFOU register 227 indicate whether a particular RAM group is tested. This capability is provided because not all algorithms can be run on all memories. For a particular RAM group to be tested the corresponding bit in RINFOL register 226 or RINFOU register 227 and the valid bit in the previous RAM group header must both be set. RINFOL register 226 indicates the validity of RAM groups 0 to 31 and RINFOU register 227 indicates the validity of RAM groups 32 to 63.

pBIST ID register 228 is a memory mapped register that is loaded with a pBIST ID at the beginning of a programming sequence to specify which of a multiple of pBIST controllers 129 is being programmed by an external tester or by the local CPU 110. Upon being reset, pBIST register assumes a value of 0x0000. Each pBIST controller 129 is assigned a unique ID value input via ID value interface 132 when the SOC integrated circuit is designed. This may be embodied by simply tying off the five-bit field to either a high or to a low reference voltage to form a five-bit ID value. Dual Address registers 230 are used in accessing memory, such as memories 111, 112, through 119.

Figure 3:
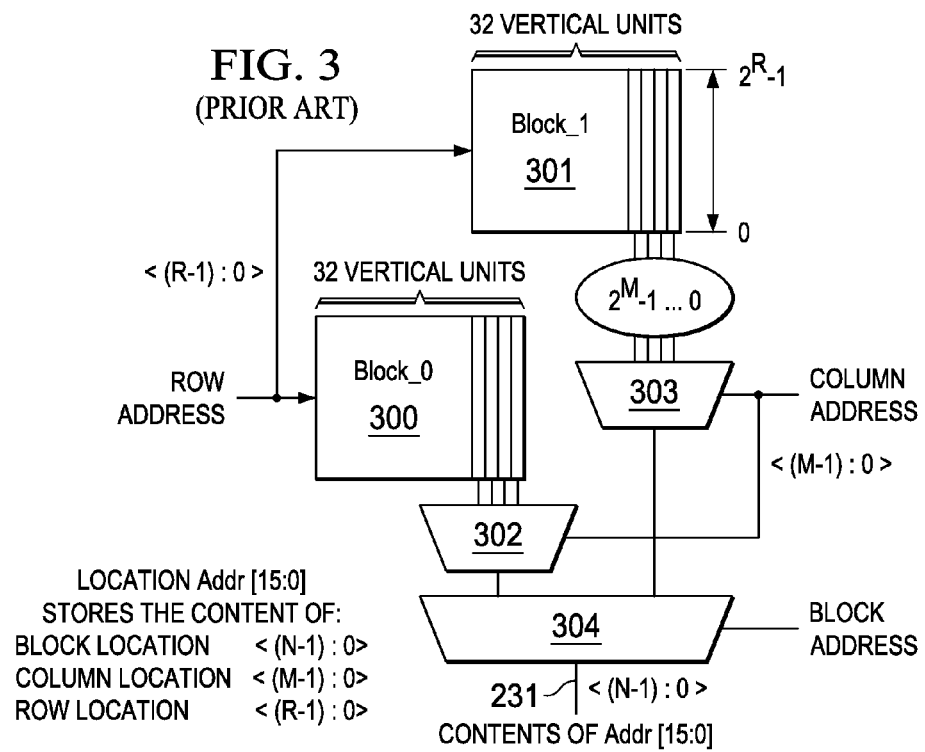
FIG. 3 is a diagram illustrating a prior art example two-block memory addressed by three address components: column address; row address; and block address.

FIG. 3 illustrates memory read portion of a prior art device included here as an example of how address scrambling may be used. In the example FIG. 3, the memory has N blocks, each block has M columns and each column has R rows. Output data from two memory blocks (block_0 300 and block_1 301_ are selected by multiplexers 302, 303 and 304. Each of the thirty-two vertical units of block_0 300 and block_1 301 contain thirty-two rows of data, each row containing four eight-bit bytes labeled bytes 0 through 3.

Row address <R-1:0> supplies the row address input of block_0 300 and block_1 301 and selects one row out of rows $2^R-1$ to 0 in each block. Data from column $2^M-1$ to column 0 are output from block_0 300 to multiplexer 302. Column address <M-1:0> supplied to the control input of multiplexer 302 selects the data for the corresponding column. Similarly, data from column $2^M-1$ to column 0 are output from block_1 301 to multiplexer 303. Column address <M-1:0> supplied to the control input of multiplexer 303 selects the data for the corresponding column. The outputs of multiplexers 302 and 303 are supplied as inputs to multiplexer 304. Block address <N-1:0> supplied to the control input of multiplexer 304 selects data from the corresponding block for output as data 231.

In the memory of FIG. 3: a column address <(M-1):0> bits wide selects between M columns; a block address <(N-1):0> bits wide selects between N blocks of memory banks; and a row address <(R-1):0> bits wide selects between R rows of logical addresses inside each bank of memory.

FIG. 3 illustrates a partitioning of the example memory blocks. The example memory of FIG. 3 requires that the SRAM addresses have two-bit column addresses <0> and <1>, two-bit row A addresses <2> and <3>, a single-bit block address <4> and a three-bit row B address <5>, <6> and <7>. The address supplied to the memory is divided into these three sections. The positions of the above regions may vary from design to design.

The prior pBIST 130 illustrated in FIGS. 1 and 2 is designed for straightforward linear addressing. Row addresses are the address least significant bits (LSBs) <0> through <4>. Column addresses are bits <5> and <6>. The block address is bit <7>. Incrementing through these addresses would fetch data from row 0 through row 31 in sequential order in block_0 300 and then data from row 32 through 63 in sequential order in block_1 301.

The first pass of this linear addressing would address block_0 300 and proceed through all row addresses sequentially fetching all column 0 data first, and all column 1 data next, followed by column 2 data and finally column 3 data. The second pass of this linear addressing would address block_1 301 and proceed through all row addresses sequentially fetching all column 0 data first, and all column 1 data next, followed by column 2 data and finally column 3 data.

In most SOC designs, the operating voltage may not be the same for all functions on the SOC. The voltage domains employed are optimized for the desired functions and sub chips. This requires that functions that operate across a plurality of sub chips must be able to function across a plurality of voltage domains.

Figure 4:
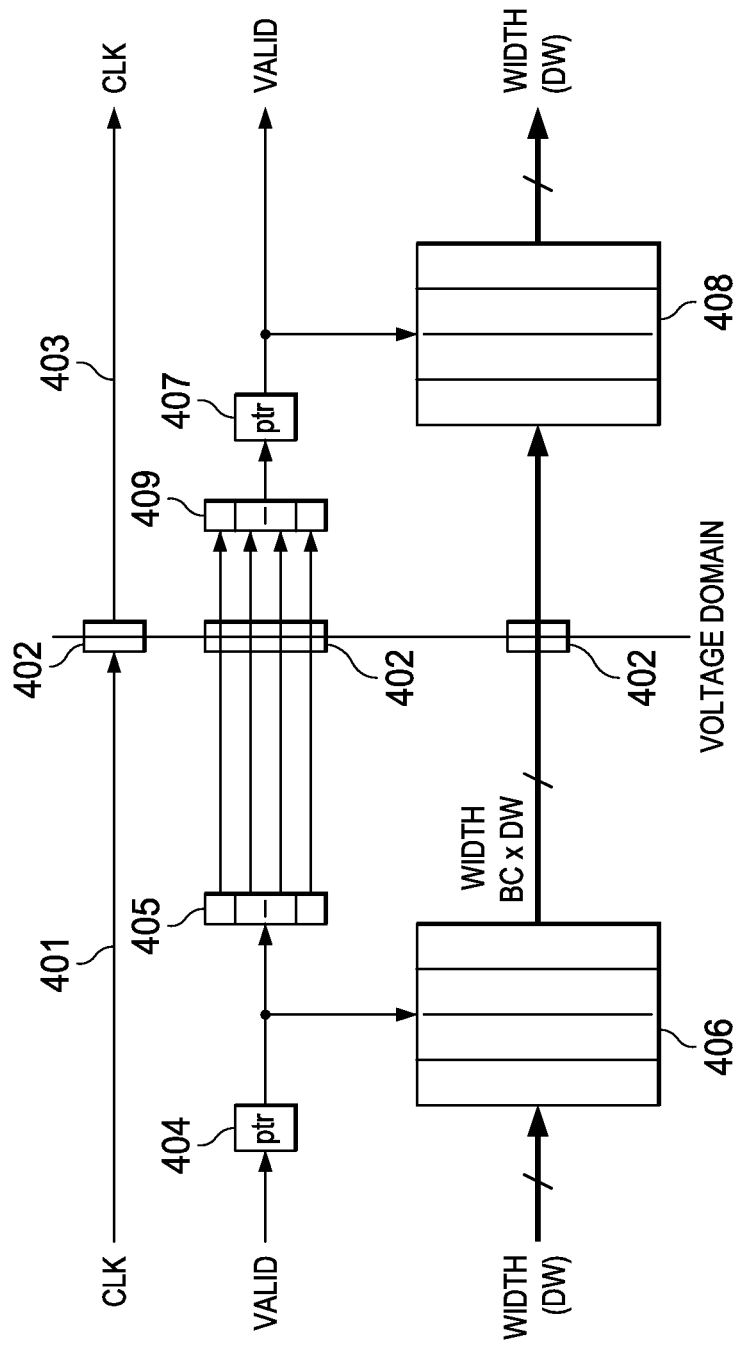
FIG. 4 shows an implementation of an asynchronous bridge operable between voltage domains.

FIG. 4 illustrates an implementation of an asynchronous bridge described in this invention. Voltages are matched by voltage shifters 402. However, voltage shifting may introduce large delays at the voltage domain boundaries that may be as large as 0.7 ns, resulting in metastable register behavior. This is resolved by the use of buffers and synchronizing registers.

Clock input 401 is voltage shifted in voltage shifter 402, resulting in clock 403, which is now asynchronous to 401 due to the time delay introduced by voltage shifter 402.

On each bus cycle pointer register 404 is incremented, and data is written into the corresponding buffer register in buffer register bank 406. The pointer register 404 is buffered in synchronizing register 405, voltage shifted by voltage shifter 402, and is further buffered in synchronizing register 409 before input to pointer register 407.

The output of buffer register bank 406 is voltage shifted by voltage shifter 402, and is input to buffer register bank 408 on the receiving side. The output of pointer register 407 selects the appropriate register in register bank 408, and provides a data valid signal.

While FIG. 4 illustrates four buffer registers in each bank, the actual number of registers employed depends on the estimated time delay introduced by the voltage shifters.

What is claimed is:

1. An embedded memory test system comprising:
   a programmable Built In Self Test (pBIST) engine;
   a plurality of sub chips performing memory testing and data logging functions; and
   a plurality of asynchronous bridges connecting the pBIST engine to said sub chips, each of said plurality of asynchronous bridges operable to voltage level shift the pBIST output signals to match a voltage domain of an applicable sub chip, each of said plurality of asynchronous bridges including
   a plurality of voltage level shifters;
   a plurality of pointer registers operable to increment on each cycle as indicated by a data valid signal;
   a plurality of synchronization registers; and
   a plurality of data buffer register banks.

2. The embedded memory test system of claim 1 wherein:
   a first pointer register is incremented by a data valid signal originating in the first voltage domain;
   an output of the first pointer register is buffered in a first synchronization register;
   an output of said first synchronization register is voltage level shifted to match a voltage of the second voltage domain;
   the voltage shifted pointer data is buffered in a second synchronization register;
   an output of said second synchronization register is input to a second pointer register;
   input data originating in the first voltage domain is buffered in a first data buffer register of a first data buffer register bank with the register within the data buffer register bank selected by the output of the first pointer register;
   an output of the first data buffer register is voltage level shifted to match a voltage of the second voltage domain;
   the voltage shifted data is input to a second data buffer register of a second data buffer register bank with the register within the data buffer register bank selected by the output of the second pointer register; and
   synchronized data is output from the second data buffer register of the second data buffer register bank with the applicable register selected by the output of the second pointer register.

\* \* \* \* \*